(12) United States Patent
Wang et al.

(10) Patent No.: US 12,230,450 B2
(45) Date of Patent: Feb. 18, 2025

(54) SEMICONDUCTOR STRUCTURE (71) Applicant: NANYA TECHNOLOGY CORPORATION, New Taipei (TW)

(72) Inventors: Mao-Ying Wang, New Taipei (TW); Yu-Ting Lin, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 18/444,758

(22) Filed: Feb. 18, 2024

(65) Prior Publication Data

US 2024/0234035 A1 Jul. 11, 2024

Related U.S. Application Data (62) Division of application No. 17/228,729, filed on Apr. 13, 2021, now Pat. No. 11,942,277.

(51) Int. Cl.
*H01G 4/33* (2006.01)
*H01G 4/012* (2006.01)
*H01G 4/30* (2006.01)
*H01L 49/02* (2006.01)

(52) U.S. Cl.
CPC .............. *H01G 4/30* (2013.01); *H01G 4/012* (2013.01); *H01G 4/33* (2013.01); *H01L 28/60* (2013.01); *H01L 28/92* (2013.01)

(58) Field of Classification Search
CPC ........... H01L 28/60; H01L 28/92; H01G 4/30; H01G 4/33
See application file for complete search history.

(56) References Cited

U.S. PATENT DOCUMENTS

| | | | |
|---|---|---|---|
| 9,721,963 B1 | 8/2017 | Rabkin et al. | |
| 2013/0069198 A1 | 3/2013 | Claeys et al. | |
| 2014/0071585 A1* | 3/2014 | Yu | H01G 4/005 361/301.2 |
| 2016/0111434 A1 | 4/2016 | Pachamuthu et al. | |
| 2016/0307908 A1 | 10/2016 | Sharangpani et al. | |
| 2020/0119134 A1 | 4/2020 | Leobandung | |
| 2021/0384196 A1* | 12/2021 | Chang | H10B 12/318 |
| 2022/0320267 A1* | 10/2022 | Hu | H10B 12/00 |

* cited by examiner

*Primary Examiner* — Walter H Swanson
*Assistant Examiner* — Jacob T Nelson
(74) *Attorney, Agent, or Firm* — CKC & Partners Co., LLC (57) ABSTRACT

A method of manufacturing a semiconductor structure includes: forming a first oxide layer over a landing pad layer; forming a middle patterned dielectric layer over the first oxide layer; sequentially forming a second oxide layer and a top dielectric layer over the middle patterned dielectric layer; forming a trench through the top dielectric layer, the second oxide layer and the first oxide layer; conformally forming a bottom conductive layer in the trench; removing a portion of the top dielectric layer adjacent to the trench to expose a portion of the second oxide layer beneath the portion of the top dielectric layer; and performing an etching process to remove the second oxide layer and the first oxide layer. A semiconductor structure is also provided.

8 Claims, 8 Drawing Sheets

SEMICONDUCTOR STRUCTURE

CROSS-REFERENCE TO RELATED APPLICATION

The present application is a Divisional Application of the U.S. application Ser. No. 17/228,729, filed Apr. 13, 2021, which is herein incorporated by reference in its entirety.

BACKGROUND

Field of Invention

The present disclosure relates to a semiconductor structure.

Description of Related Art

As the semiconductor industry introduces new generations of integrated circuits (IC's) having higher performance and providing greater functionality, the density of the elements that form the ICs is increased, while the dimensions and spacing between the individual elements are reduced. The device geometries having smaller dimensions are creating new manufacturing challenges.

For example, the formation of a stack capacitor involves several complicated operations. One of challenges in the stack capacitor is to avoid capacitance loss due to loss of a storage conductive layer when the stack capacitor is manufactured. Therefore, how to decrease the loss of the storage conductive layer when the stack capacitor is manufactured has become a technical issue to be solved in this field.

SUMMARY

The present disclosure provides a method of manufacturing a semiconductor structure which can significantly decrease loss of a storage conductive layer when the semiconductor structure is manufactured.

In accordance with an aspect of the present disclosure, a semiconductor structure includes a landing pad layer, a middle patterned dielectric layer, a top patterned dielectric layer, and a plurality of trench conductive layers. The middle patterned dielectric layer is disposed over the landing pad layer, in which the middle patterned dielectric layer includes a plurality of first openings. The top patterned dielectric layer is disposed over the middle patterned dielectric layer, in which the top patterned dielectric layer includes a plurality of second openings substantially aligned with the first openings, respectively. Each of the trench conductive layers is disposed through a portion of one of the second openings and a portion of one of the first openings, and each of the trench conductive layers has two side layers opposite to each other, and a height difference between a lower one of the two side layers and a lower surface of the top patterned dielectric layer is in a range of from 0 to 50 nm.

According to some embodiments of the present disclosure, one of the two side layers is in contact with the top patterned dielectric layer and the middle patterned dielectric layer, and the other of the two side layers is separated from the top patterned dielectric layer and the middle patterned dielectric layer.

According to some embodiments of the present disclosure, a height of the one of the two side layers is higher than a height of the other of the two side layers.

According to some embodiments of the present disclosure, the top patterned dielectric layer has an upper surface coplanar with an upper surface of the one of the two side layers.

According to some embodiments of the present disclosure, a height difference between the two side layers is less than or equal to 100 nm.

According to some embodiments of the present disclosure, the semiconductor structure further includes a bottom patterned dielectric layer disposed between the landing pad layer and the middle patterned dielectric layer, in which the bottom patterned dielectric layer includes a plurality of third openings substantially aligned with the first openings, respectively.

According to some embodiments of the present disclosure, an edge of the bottom patterned dielectric layer extends beyond an edge of the middle patterned dielectric layer.

According to some embodiments of the present disclosure, the semiconductor structure further includes a high-k dielectric layer covering the trench conductive layers; a top conductive layer covering the high-k dielectric layer; and a semiconductor layer covering the top conductive layer.

According to some embodiments of the present disclosure, a ratio of the height difference to a distance between the middle patterned dielectric layer and the top patterned dielectric layer is between 0 and 0.1.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

In order that the present disclosure is described in detail and completeness, implementation aspects and specific embodiments of the present disclosure with illustrative description are presented, but it is not the only form for implementation or use of the specific embodiments of the present disclosure. The embodiments disclosed herein may be combined or substituted with each other in an advantageous manner, and other embodiments may be added to an embodiment without further description. In the following description, numerous specific details will be described in detail in order to enable the reader to fully understand the following embodiments. However, the embodiments of the present disclosure may be practiced without these specific details.

Further, spatially relative terms, such as "beneath," "over," and the like, may be used herein for ease of description to describe one element or feature's relationship to another element(s) or feature(s) as shown in the figures. The true meaning of the spatially relative terms includes other orientations. For example, when the figure is flipped up and down by 180 degrees, the relationship between one component and another component may change from "beneath" to "over." In addition, the spatially relative descriptions used herein should be interpreted the same.

As mentioned in the related art, how to decrease the loss of the storage conductive layer when the stack capacitor is manufactured has become a technical issue to be solved in this field. Therefore, the present disclosure provides a method of manufacturing a semiconductor structure which can significantly decrease loss of the storage conductive layer when the semiconductor structure is manufactured. Various embodiments of the method of manufacturing the semiconductor structure and how to significantly decrease loss of the storage conductive layer will be described below.

FIGS. 1, 2, 3, 4, 5, 6 and 7A are cross-sectional views of a method of manufacturing a semiconductor structure at various stages in accordance with some embodiments of the present disclosure.

Figure 1:
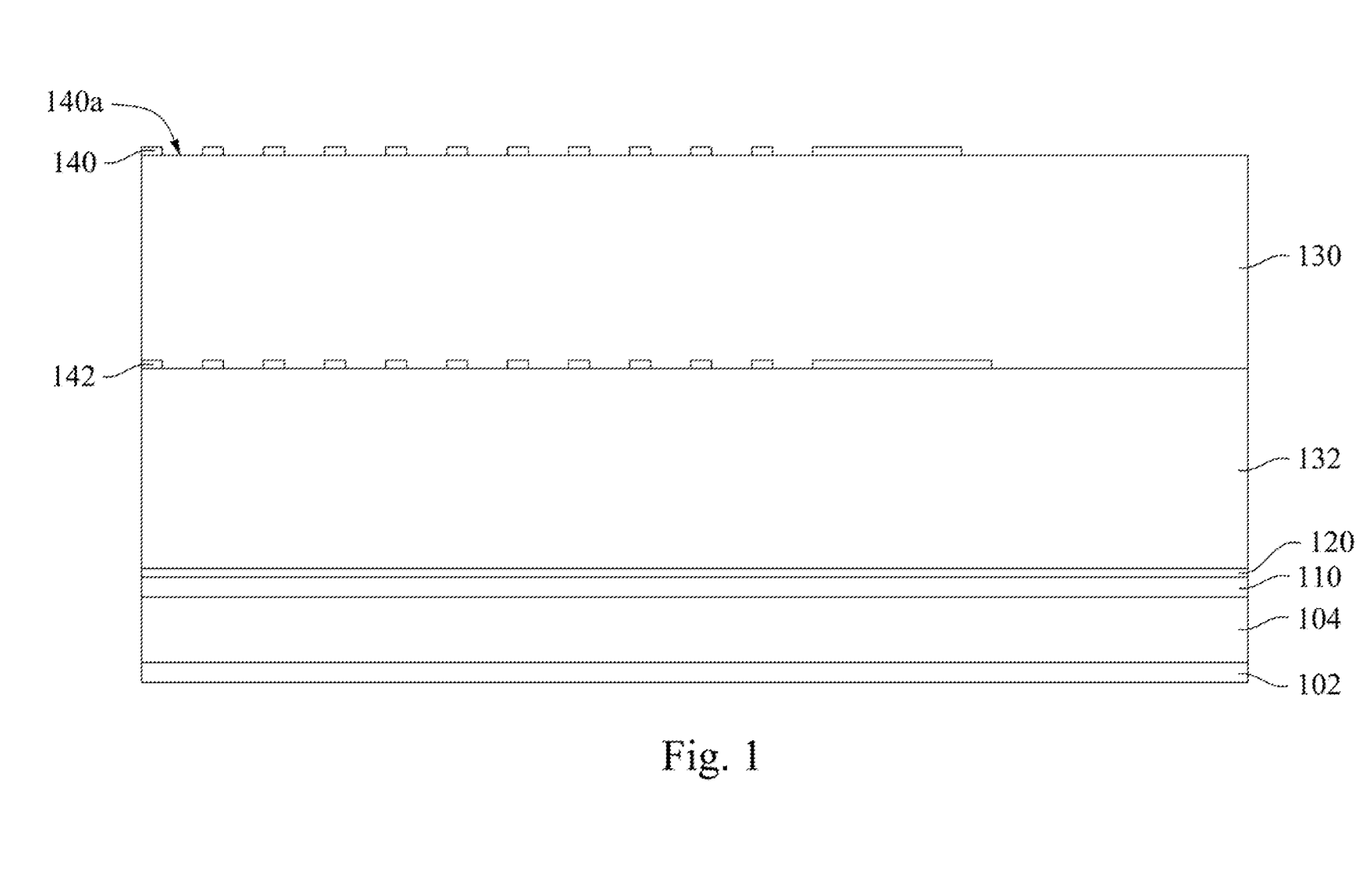
FIGS. 1, 2, 3, 4, 5, 6 and 7A are cross-sectional views of a method of manufacturing a semiconductor structure at various stages in accordance with some embodiments of the present disclosure.

In some embodiments, as shown in FIG. 1, a substrate 102 is provided. In some embodiments, the substrate 102 includes a semiconductor material, such as an elementary semiconductor including silicon or germanium in crystal, polycrystalline, and/or an amorphous structure; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; any other suitable material; and/or a combination thereof.

In some embodiments, as shown in FIG. 1, a dielectric layer 104 is provided on the substrate 102. In some embodiments, the dielectric layer 104 includes silicon nitride, silicon oxide, silicon oxynitride, silicon carbide, silicon carbon nitride, or a combination thereof.

In some embodiments, as shown in FIG. 1, a landing pad layer 110 is provided on the dielectric layer 104. In some embodiments, the landing pad layer 110 includes doped polysilicon (Si), tungsten (W), tungsten silicide (WSi), aluminum (Al), titanium (Ti), titanium nitride (TiN), cobalt (Co) or a combination thereof, but the disclosure is not limited thereto.

In some embodiments, as shown in FIG. 1, a bottom dielectric layer 120 is provided on the landing pad layer 110. In some embodiments, the bottom dielectric layer 120 includes silicon nitride, silicon oxynitride, silicon carbide, silicon carbon nitride, or a combination thereof, but the disclosure is not limited thereto.

As shown in FIG. 1, a first oxide layer 130 is formed over the landing pad layer 110. In some embodiments, the first oxide layer 130 includes silicon oxide. In some embodiments, formation of the first oxide layer 130 may include any suitable deposition method, such as coating, atomic layer deposition (ALD), plasma-enhanced atomic layer deposition (PEALD), chemical vapor deposition (CVD), plasma-enhanced chemical vapor deposition (PECVD), low pressure chemical vapor deposition (LPCVD), physical vapor deposition (PVD) (e.g., sputtering), and the like.

As shown in FIG. 1, a middle patterned dielectric layer 140 is formed over the first oxide layer 130 and has a plurality of first openings 140a exposing a plurality of portions of the first oxide layer 130. In some embodiments, the middle patterned dielectric layer 140 includes silicon nitride, silicon oxynitride, silicon carbide, silicon carbon nitride, or a combination thereof. In some embodiments, a dielectric layer (not shown) is formed over the first oxide layer 130, and a patterning process, such as photolithography and etching processes, is performed on the dielectric layer to form the middle patterned dielectric layer 140.

In some embodiments, as shown in FIG. 1, before the first oxide layer 130 and the middle patterned dielectric layer 140 are formed, a bottom oxide layer 132 and a bottom patterned dielectric layer 142 are sequentially formed. In some embodiments, the bottom oxide layer 132 is formed over the bottom dielectric layer 120, and the bottom patterned dielectric layer 142 is formed over the bottom oxide layer 132. In some embodiments, a dielectric layer (not shown) is formed over the bottom oxide layer 132, and a patterning process, such as photolithography and etching processes, is performed on the dielectric layer to form the bottom patterned dielectric layer 142.

Figure 2:
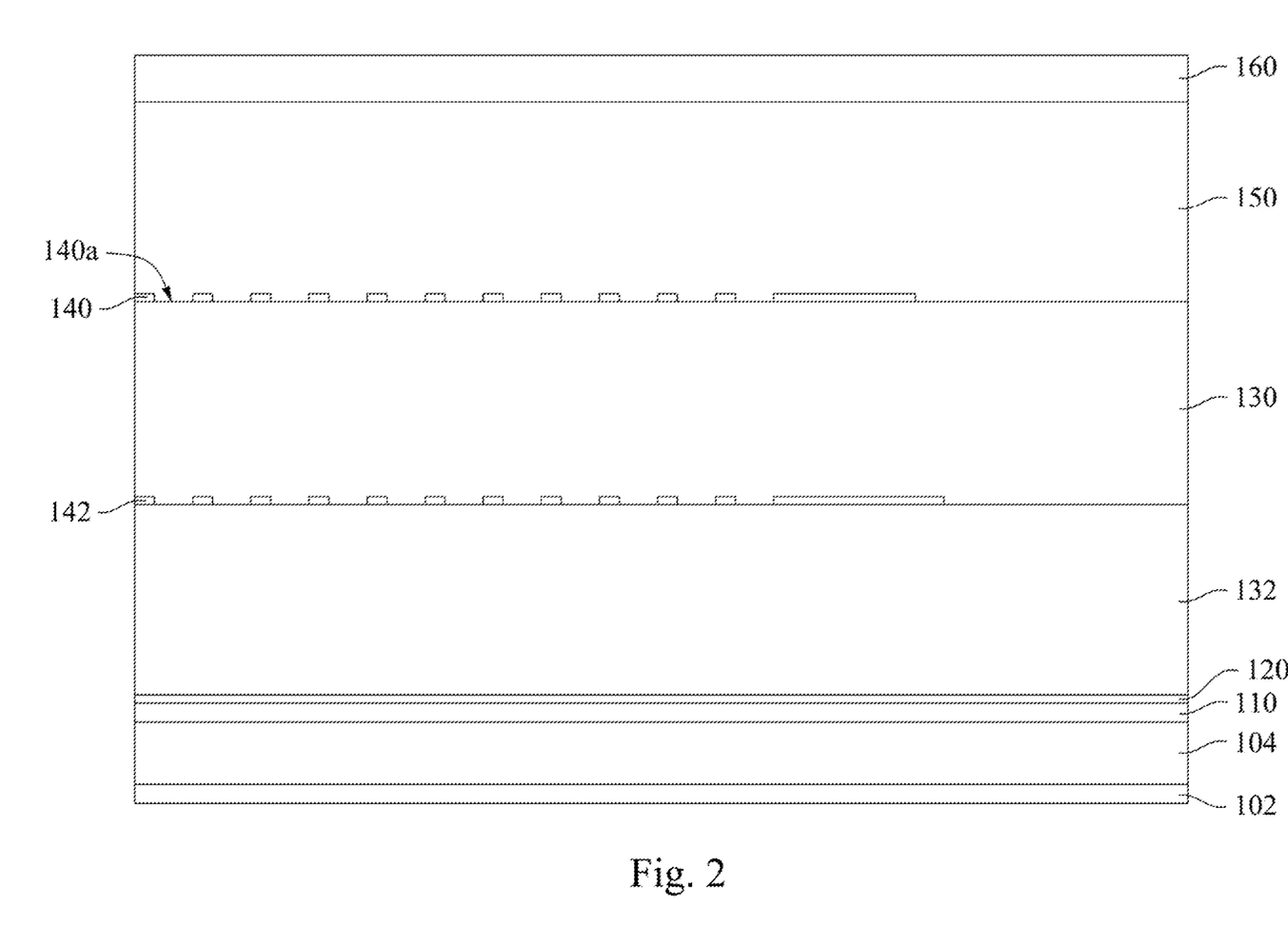

As shown in FIGS. 1 and 2, after the middle patterned dielectric layer 140 is formed, a second oxide layer 150 and a top dielectric layer 160 are sequentially formed over the middle patterned dielectric layer 140. In some embodiments, sequentially forming the second oxide layer 150 and the top dielectric layer 160 over the middle patterned dielectric layer 140 includes forming the second oxide layer 150 in the first openings 140a.

In some embodiments, the second oxide layer 150 includes silicon oxide, and the top dielectric layer 160 includes silicon nitride, silicon oxynitride, silicon carbide, silicon carbon nitride, or a combination thereof. In some embodiments, formations of the second oxide layer 150 and the top dielectric layer 160 may include any suitable deposition method, such as coating, ALD, PEALD, CVD, PECVD, LPCVD, PVD (e.g., sputtering), and the like.

Figure 3:
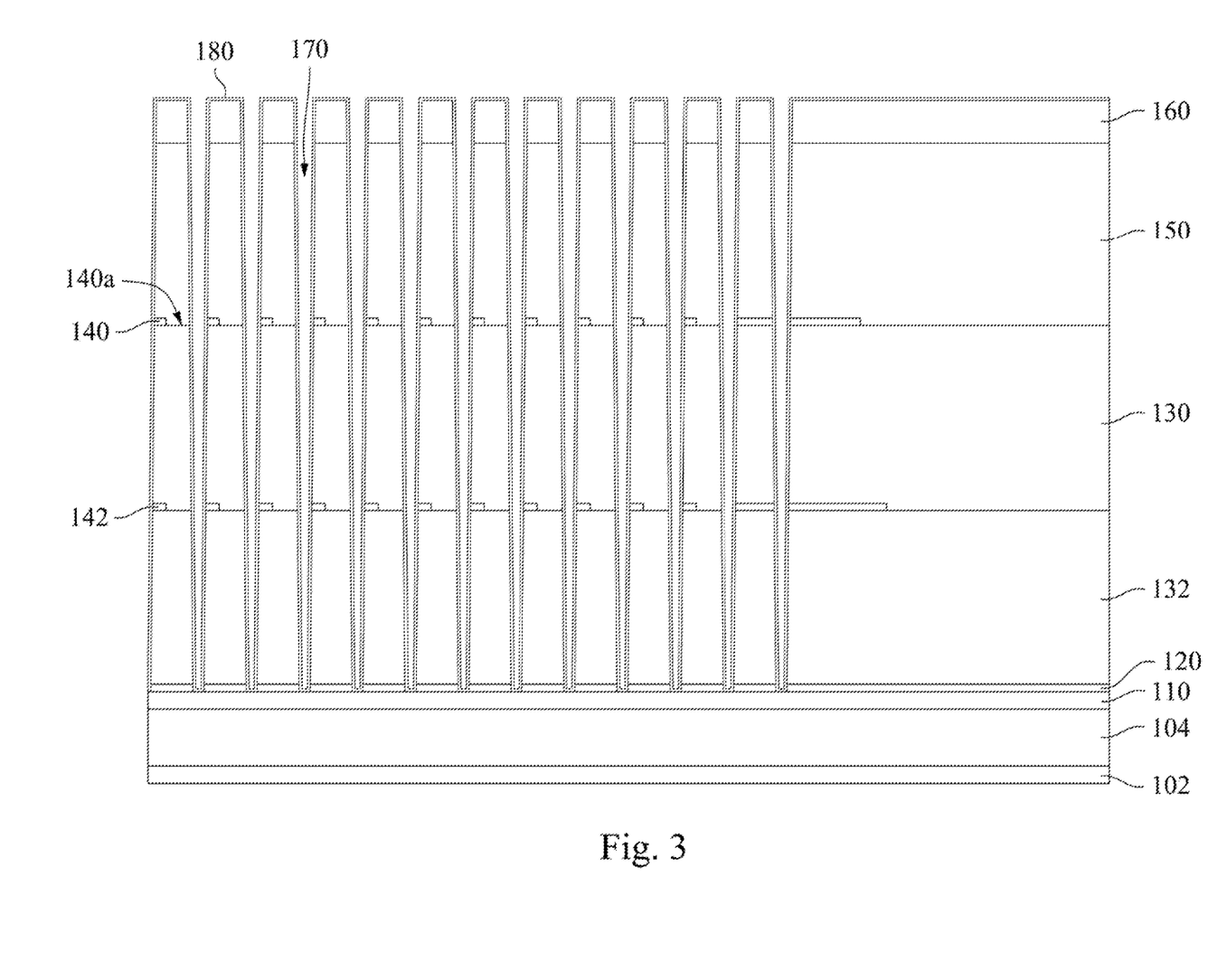

As shown in FIGS. 2 and 3, a trench 170 is formed through the top dielectric layer 160, the second oxide layer 150 and the first oxide layer 130. In some embodiments, forming the trench 170 through the top dielectric layer 160, the second oxide layer 150 and the first oxide layer 130 includes forming the trench 170 through a portion of the first opening 140a. In some embodiments, the trench 170 is formed further through the bottom oxide layer 132 and the bottom dielectric layer 120 to expose a portion of the landing pad layer 110. In some embodiments, formation of the trench 170 includes performing photolithography and etching processes.

As shown in FIG. 3, after the trench 170 is formed, a bottom conductive layer 180 is conformally formed in the trench 170. The bottom conductive layer 180 may be also called as a bottom electrode layer, a trench conductive layer or a storage conductive layer. In some embodiments, the bottom conductive layer 180 is formed on a top surface of the top dielectric layer 160, exposed side surfaces of the top dielectric layer 160, exposed side surfaces of the second oxide layer 150 and exposed side surfaces of the first oxide layer 130.

In some embodiments, the bottom conductive layer 180 includes a metal-containing material, such as titanium (Ti), tantalum (Ta), tungsten (W), aluminum (Al), zirconium (Zr), hafnium (Hf), titanium aluminum (TiAl), tantalum aluminum (TaAl), tungsten aluminum (WAl), zirconium aluminum (ZrAl), hafnium aluminum (HfAl), titanium nitride (TiN), tantalum nitride (TaN), titanium silicon nitride (TiSiN), tantalum silicon nitride (TaSiN), tungsten silicon nitride (WSiN), titanium carbide (TiC), tantalum carbide (TaC), titanium aluminum carbide (TiAlC), tantalum aluminum carbide (TaAlC), titanium aluminum nitride (TiAlN), tantalum aluminum nitride (TaAlN), any other suitable metal-containing material or a combination thereof. In some embodiments, formation of the bottom conductive layer 180 may include any suitable deposition method, such as coating, ALD, PEALD, CVD, PECVD, LPCVD, PVD (e.g., sputtering), and the like.

Figure 4:
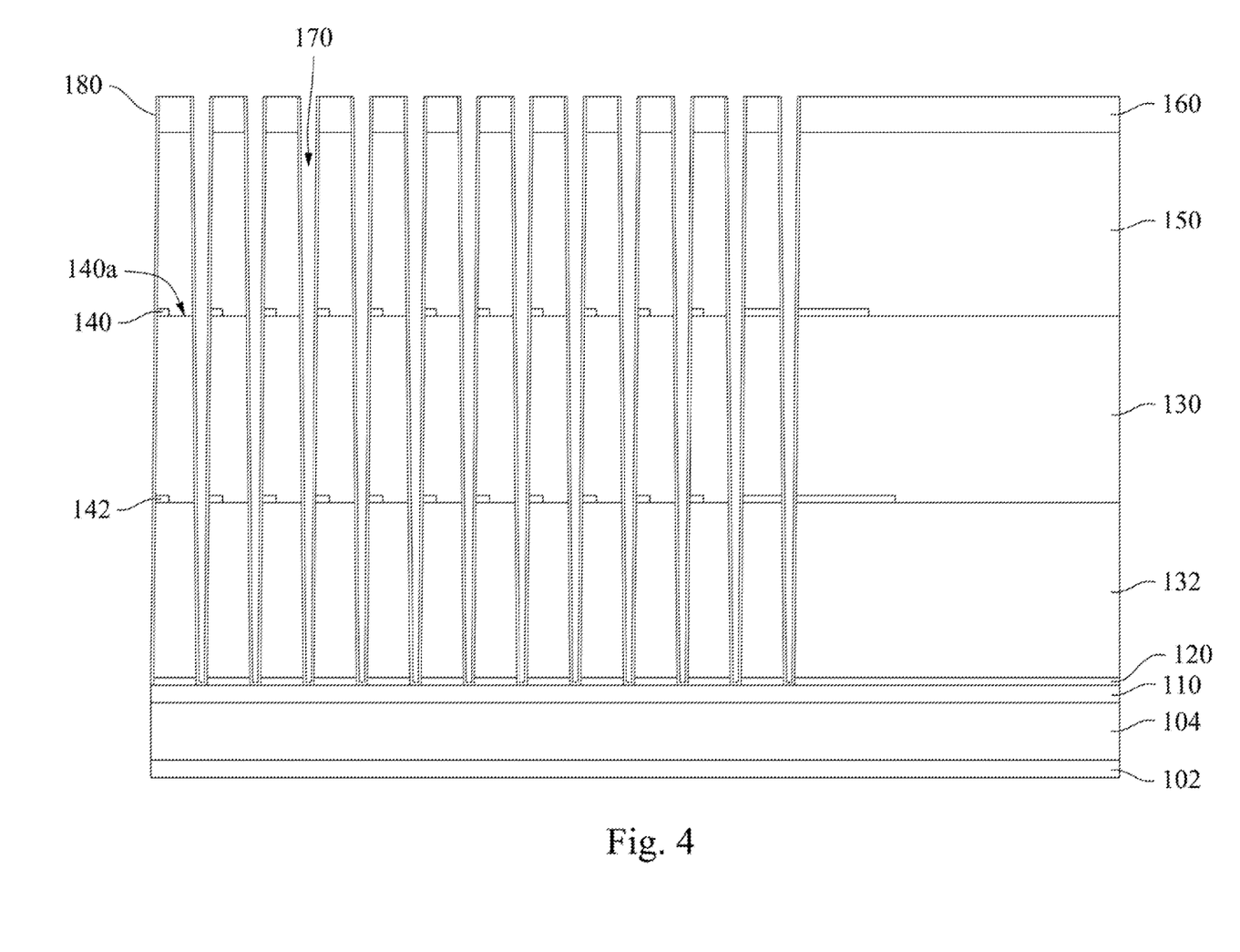

In some embodiments, as shown in FIGS. 3 and 4, the method further includes performing a polishing process (e.g., chemical mechanical polishing (CMP) or other suitable method) on the bottom conductive layer 180 to remove the bottom conductive layer 180 on the top surface of the top dielectric layer 160. In other words, the polishing process is used to expose the top surface of the top dielectric layer 160.

Figure 5:
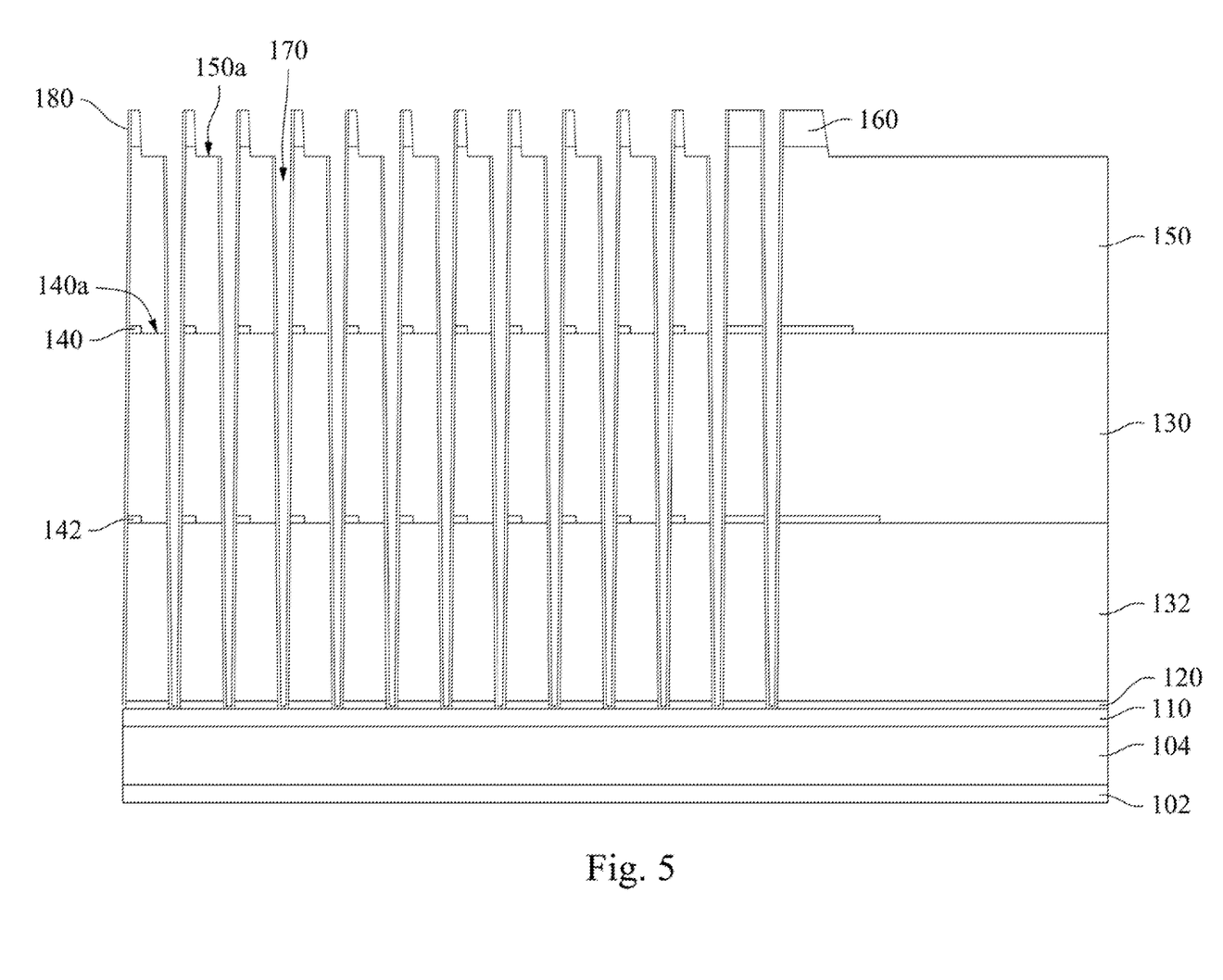

As shown in FIGS. 4 and 5, a portion of the top dielectric layer 160 adjacent to the trench 170 is removed to expose a portion 150a of the second oxide layer 150 beneath the removed portion of the top dielectric layer 160. In some embodiments, removing the portion of the top dielectric layer 160 adjacent to the trench 170 includes performing a photolithography process and a dry etching process on the top dielectric layer 160. In some embodiments, as shown in FIGS. 4 and 5, the dry etching process is performed to remove the portion of the top dielectric layer 160 and a thin portion of the second oxide layer 150 therebeneath to ensure the second oxide layer 150 is exposed, but not limited thereto. In some embodiments, it is found that the dry etching process may result in loss of the bottom conductive layer 180, such as loss of the bottom conductive layer 180 adjacent to the removed portion of the top dielectric layer 160 and adjacent to the removed thin portion of the second oxide layer 150.

Figure 6:
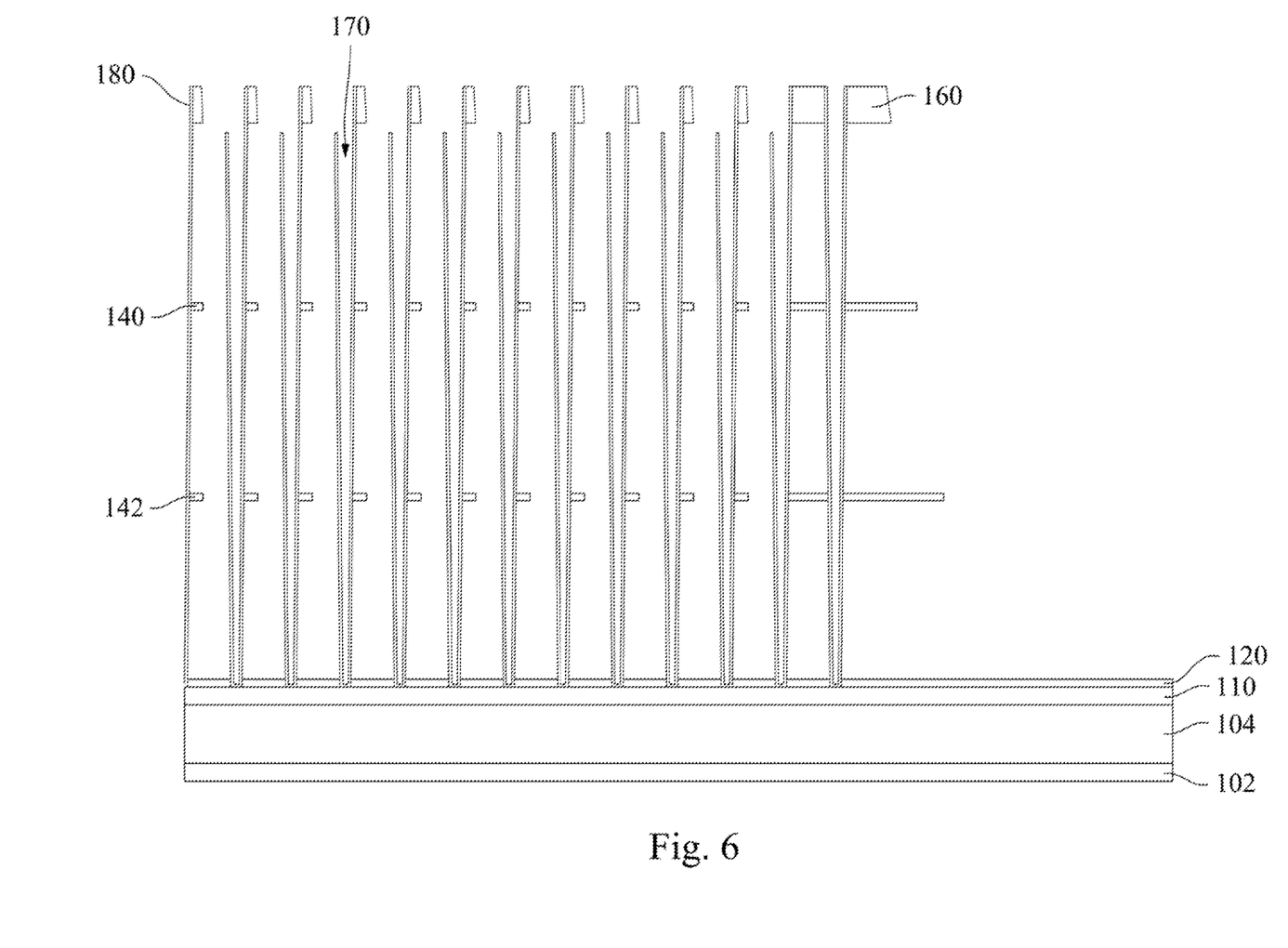

As shown in FIGS. 5 and 6, an etching process is performed to completely remove the second oxide layer 150, the first oxide layer 130, and the bottom oxide layer 132. In some embodiments, performing the etching process to remove the second oxide layer 150, the first oxide layer 130, and the bottom oxide layer 132 includes performing a wet etching process. In some embodiments, it is found that the wet etching process may result in slight loss of the bottom conductive layer 180.

It is noteworthy that since the middle patterned dielectric layer 140 has the first openings 140a (as shown in FIG. 5), the second oxide layer 150 and the first oxide layer 130 can be once removed using the wet etching process. Therefore, the loss of the bottom conductive layer 180 can be minimized, and thus can decrease capacitance loss due to loss of the bottom conductive layer 180 when the semiconductor structure is manufactured.

In contrast, if the middle dielectric layer does not have first openings (not shown), after the second oxide layer is removed, an additional patterning process (e.g., a photolithography process and a dry etching process) is required to perform on the middle dielectric layer to expose the first oxide layer, and an additional wet etching process is required to remove the first oxide layer, which results in further loss of the bottom conductive layer due to the additional patterning process and the additional wet etching process, causing greater capacitance loss.

Figure 7A:
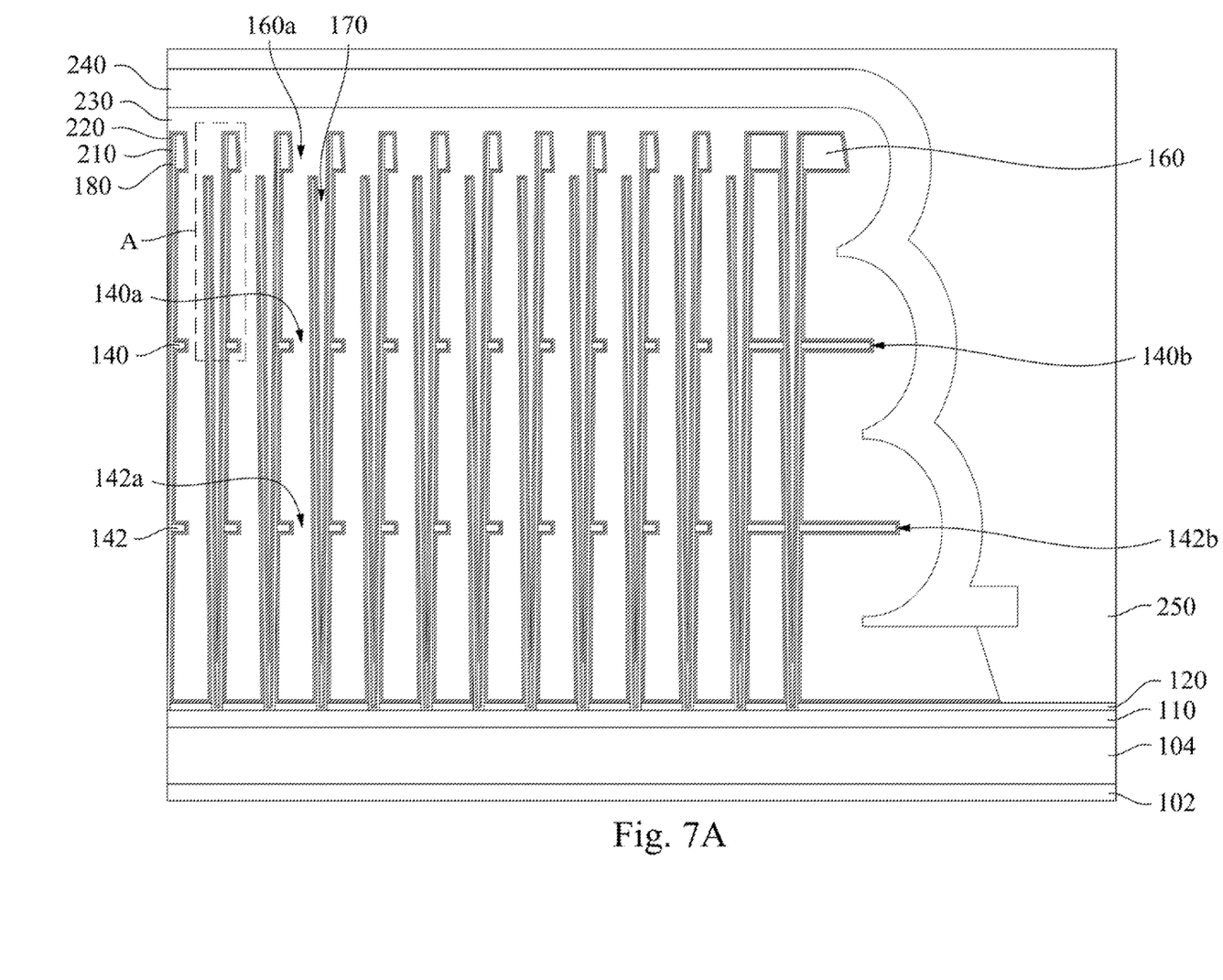

In some embodiments, as shown in FIGS. 6 and 7A, the method further includes forming a high-k dielectric layer 210 covering the bottom conductive layer 180 after performing the etching process; forming a top conductive layer 220 covering the high-k dielectric layer 210; and forming a semiconductor layer 230 covering the top conductive layer 220.

In some embodiments, as shown in FIGS. 6 and 7A, the high-k dielectric layer 210 and the top conductive layer 220 are sequentially formed to conformally cover the bottom conductive layer 180, the top dielectric layer 160 and the middle patterned dielectric layer 140. In some embodiments, as shown in FIGS. 6 and 7A, the semiconductor layer 230 is further filled in the trench 170 and in the space formed after the second oxide layer 150 and the first oxide layer 130 (shown in FIG. 5) are removed.

In some embodiments, the high-k dielectric layer 210 includes silicon oxide, silicon nitride, silicon oxynitride, metal oxide such as hafnium oxide, hafnium silicon oxide, hafnium silicon oxynitride or other suitable material, but the disclosure is not limited thereto.

In some embodiments, the top conductive layer 220 includes a metal-containing material, such as Ti, Ta, W, Al, Zr, Hf, TiAl, TaAl, WAl, ZrAl, HfAl, TiN, TaN, TiSiN, TaSiN, WSiN, TiC, TaC, TiAlC, TaAlC, TiAlN, TaAlN, any other suitable metal-containing material or a combination thereof, but the disclosure is not limited thereto.

In some embodiments, the semiconductor layer 230 includes an elementary semiconductor including silicon or germanium in crystal, polycrystalline, and/or an amorphous structure; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; any other suitable material; and/or a combination thereof, but the disclosure is not limited thereto. In some embodiments, the semiconductor layer 230 is single-layered or multi-layered.

In some embodiments, as shown in FIG. 7A, after the semiconductor layer 230 is formed, an outer conductive layer 240 is formed. In some embodiments, the outer conductive layer 240 includes a metal-containing material, such as Ti, Ta, W, Al, Zr, Hf, TiAl, TaAl, WAl, ZrAl, HfAl, TiN, TaN, TiSiN, TaSiN, WSiN, TiC, TaC, TiAlC, TaAlC, TiAlN, TaAlN, any other suitable metal-containing material or a combination thereof, but the disclosure is not limited thereto. In some embodiments, the outer conductive layer 240 is single-layered or multi-layered.

In some embodiments, as shown in FIG. 7A, after the outer conductive layer 240 is formed, an outer oxide layer 250 is formed. In some embodiments, the outer oxide layer 250 includes silicon oxide. In some embodiments, the outer oxide layer 250 is single-layered or multi-layered.

In some embodiments, formations of the high-k dielectric layer 210, the top conductive layer 220, the semiconductor layer 230, the outer conductive layer 240 and the outer oxide layer 250 may include any suitable deposition method, such as coating, ALD, PEALD, CVD, PECVD, LPCVD, PVD (e.g., sputtering), and the like.

The present disclosure further provides a semiconductor structure. As shown in FIG. 7A, the semiconductor structure includes a landing pad layer 110, a middle patterned dielectric layer 140, a top patterned dielectric layer 160, and a plurality of trench conductive layers 180. The trench conductive layers 180 may be also called as bottom conductive layers, bottom electrode layers, or storage conductive layers.

The middle patterned dielectric layer 140 is disposed over the landing pad layer 110, in which the middle patterned dielectric layer 140 includes a plurality of first openings 140a.

The top patterned dielectric layer 160 is disposed over the middle patterned dielectric layer 140, in which the top patterned dielectric layer 160 includes a plurality of second openings 160a substantially aligned with the first openings 140a, respectively.

Each of the trench conductive layers 180 is disposed through a portion of one of the second openings 160a and a portion of one of the first openings 140a.

Figure 7B:
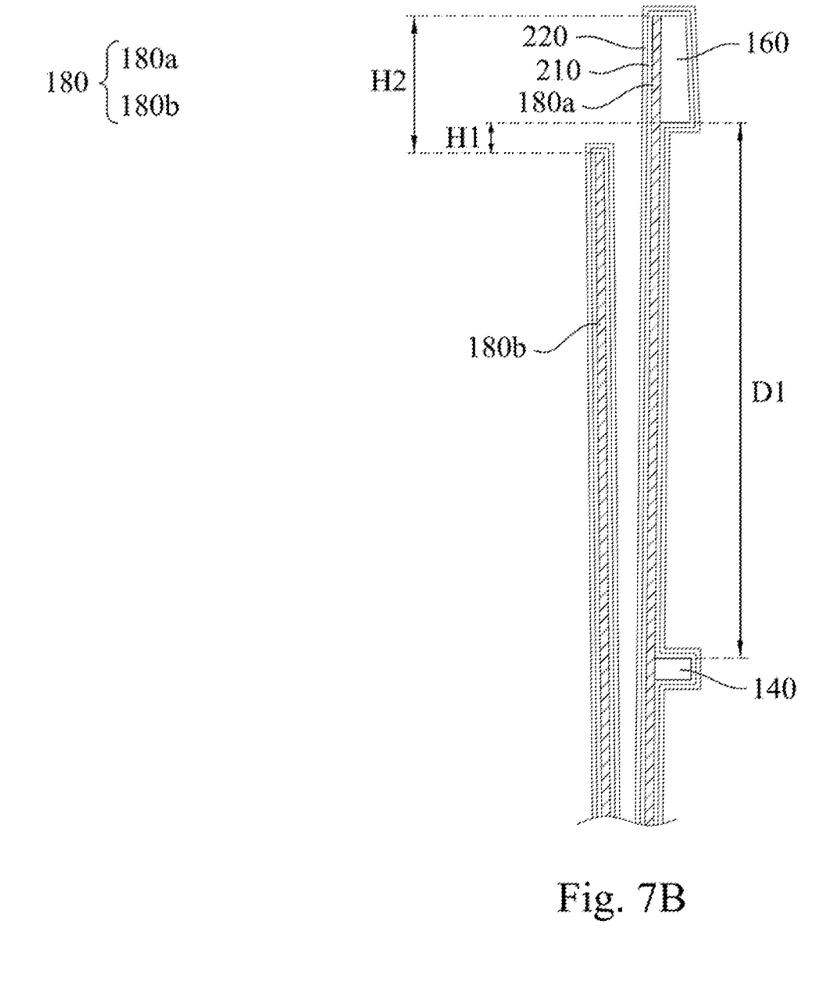
FIG. 7B is an enlarged view of area A in FIG. 7A.

FIG. 7B is an enlarged view of area A in FIG. 7A. As shown in FIG. 7B, each of the trench conductive layers 180 has two side layers 180a, 180b opposite to each other. A height difference H1 between a lower one of the two side layers 180a, 180b and a lower surface of the top patterned dielectric layer 160 is in a range of from 0 to 50 nm, such as 5 nm, 10 nm, 15 nm, 20 nm, 25 nm, 30 nm, 35 nm, 40 nm or 45 nm.

In some embodiments, a ratio of the height difference H1 between the lower one of the two side layers 180a, 180b and the lower surface of the top patterned dielectric layer 160 to a distance D1 between the middle patterned dielectric layer 140 (i.e., the patterned dielectric layer closest to the top patterned dielectric layer 160) and the top patterned dielectric layer 160 is between 0 and 0.1, for example, such as 0.01, 0.02, 0.03, 0.04, 0.05, 0.06, 0.07, 0.08, or 0.09. In some embodiments, the ratio of the height difference H1 to the distance D1 is between 0 and 0.08.

In some embodiments, as shown in FIG. 7B, one of the two side layers 180a, 180b is in contact with a side surface of the top patterned dielectric layer 160 and a side surface of the middle patterned dielectric layer 140, and the other of the two side layers 180a, 180b is separated from the top patterned dielectric layer 160 and the middle patterned dielectric layer 140.

In some embodiments, as shown in FIG. 7B, a height of the one of the two side layers 180a, 180b is higher than a height of the other of the two side layers 180a, 180b.

In some embodiments, as shown in FIG. 7B, the top patterned dielectric layer 160 has an upper surface coplanar with an upper surface of the higher one of the two side layers 180a, 180b.

In some embodiments, as shown in FIG. 7B, a height difference H2 between the two side layers 180a, 180b is less than or equal to 100 nm. In some embodiments, the height difference H2 is in a range of from 60 nm to 100 nm, such as 65 nm, 70 nm, 75 nm, 80 nm, 85 nm, 90 nm or 95 nm.

In some embodiments, as shown in FIGS. 7A and 7B, the semiconductor structure further includes a high-k dielectric layer 210 covering the trench conductive layers 180; a top conductive layer 220 covering the high-k dielectric layer 210; and a semiconductor layer 230 covering the top conductive layer 220.

In some embodiments, the high-k dielectric layer 210 and the top conductive layer 220 conformally cover the bottom conductive layer 180, the top patterned dielectric layer 160 and the middle patterned dielectric layer 140.

In some embodiments, as shown in FIG. 7A, the semiconductor structure further includes an outer conductive layer 240 and an outer oxide layer 250.

In some embodiments, as shown in FIG. 7A, the semiconductor structure further includes a bottom patterned dielectric layer 142 disposed between the landing pad layer 110 and the middle patterned dielectric layer 140. The bottom patterned dielectric layer 142 includes a plurality of third openings 142a substantially aligned with the first openings 140a, respectively.

In some embodiments, as shown in FIG. 7A, an edge 142b of the bottom patterned dielectric layer 142 extends beyond an edge 140b of the middle patterned dielectric layer 140, and thus can release stress formed at the corner (i.e., between the edge 140b of the middle patterned dielectric layer 140 and the landing pad layer 110) of the outer oxide layer 250. In other words, the stress is not easily accumulated at the corner of the outer oxide layer 250 due to the presence of the extending edge 142b of the bottom patterned dielectric layer 142.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the invention. In view of the foregoing, it is intended that the present disclosure cover modifications and variations of this invention provided they fall within the scope of the following claims.

What is claimed is:

1. A semiconductor structure, comprising:
   a landing pad layer;
   a middle patterned dielectric layer disposed over the landing pad layer, wherein the middle patterned dielectric layer comprises a plurality of first openings;
   a top patterned dielectric layer disposed over the middle patterned dielectric layer, wherein the top patterned dielectric layer comprises a plurality of second openings substantially aligned with the first openings, respectively;
   a bottom patterned dielectric layer disposed between the landing pad layer and the middle patterned dielectric layer, wherein the bottom patterned dielectric layer comprises a plurality of third openings substantially aligned with the first openings, respectively; and
   a plurality of trench conductive layers, wherein each of the trench conductive layers is disposed through a portion of one of the second openings and a portion of one of the first openings, and each of the trench conductive layers has two side layers opposite to each other, and a height difference between a lower one of the two side layers and a lower surface of the top patterned dielectric layer is in a range of 0 to 50 nm.

2. The semiconductor structure of claim 1, wherein one of the two side layers is in contact with the top patterned dielectric layer and the middle patterned dielectric layer, and the other of the two side layers is separated from the top patterned dielectric layer and the middle patterned dielectric layer.

3. The semiconductor structure of claim 2, wherein a height of the one of the two side layers is higher than a height of the other of the two side layers.

4. The semiconductor structure of claim 2, wherein the top patterned dielectric layer has an upper surface coplanar with an upper surface of the one of the two side layers.

5. The semiconductor structure of claim 1, wherein a height difference between the two side layers is less than or equal to 100 nm.

6. The semiconductor structure of claim 1, wherein an edge of the bottom patterned dielectric layer extends beyond an edge of the middle patterned dielectric layer.

7. The semiconductor structure of claim 1, further comprising:
   a high-k dielectric layer covering the trench conductive layers;
   a top conductive layer covering the high-k dielectric layer; and
   a semiconductor layer covering the top conductive layer.

8. The semiconductor structure of claim 1, wherein a ratio of the height difference to a distance between the middle patterned dielectric layer and the top patterned dielectric layer is between 0 and 0.1.

* * * * *